United States Patent
Hasegawa et al.

(10) Patent No.: US 12,415,419 B2
(45) Date of Patent: Sep. 16, 2025

(54) DISPLAY DEVICE, MOVABLE OBJECT

(71) Applicant: Panasonic Intellectual Property Management Co., Ltd., Osaka (JP)

(72) Inventors: Kenji Hasegawa, Osaka (JP); Eiichi Uriu, Osaka (JP); Tasuku Ishibashi, Ishikawa (JP); Shuji Yamashita, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 629 days.

(21) Appl. No.: 17/767,334

(22) PCT Filed: Aug. 5, 2020

(86) PCT No.: PCT/JP2020/029963
§ 371 (c)(1),
(2) Date: Apr. 7, 2022

(87) PCT Pub. No.: WO2021/075127
PCT Pub. Date: Apr. 22, 2021

(65) Prior Publication Data
US 2022/0371440 A1  Nov. 24, 2022

(30) Foreign Application Priority Data
Oct. 18, 2019  (JP) .................................. 2019-191498

(51) Int. Cl.
*B60K 35/22* (2024.01)
*B32B 7/022* (2019.01)
(Continued)

(52) U.S. Cl.
CPC .............. *B60K 35/22* (2024.01); *B32B 7/022* (2019.01); *B32B 7/05* (2019.01); *B32B 17/06* (2013.01);
(Continued)

(58) Field of Classification Search
CPC ........ B60K 35/00; B60K 35/22; B60K 35/50; B60K 35/60; B60K 2360/27;
(Continued)

(56) References Cited

U.S. PATENT DOCUMENTS

| | | |
|---|---|---|
| 2003/0134488 A1 | 7/2003 | Yamazaki et al. |
| 2004/0160388 A1 | 8/2004 | O'Keeffe |

(Continued)

FOREIGN PATENT DOCUMENTS

| | | |
|---|---|---|
| JP | H11-198679 A | 7/1999 |
| JP | 2003-258211 A | 9/2003 |

(Continued)

OTHER PUBLICATIONS

International Search Report dated Oct. 27, 2020 issued in International Patent Application No. PCT/JP2020/029963, with English translation.

*Primary Examiner* — Lawrence D Ferguson
(74) *Attorney, Agent, or Firm* — Rimon P.C.

(57) ABSTRACT

A display device includes a glass pane, a display panel which is transmissive, and a glass panel unit. The display panel faces a prescribed area of the glass pane and is within the prescribed area. The glass panel unit is disposed between the prescribed area of the glass pane and the display panel and is within the prescribed area. The glass panel unit has an internal space which is in a pressure-reduced condition.

14 Claims, 12 Drawing Sheets

(51) Int. Cl.
  *B32B 7/05* (2019.01)
  *B32B 17/06* (2006.01)
  *B60K 35/00* (2006.01)
  *B60K 35/50* (2024.01)
  *B60K 35/60* (2024.01)
  *H10K 59/80* (2023.01)

(52) U.S. Cl.
  CPC ........ *B60K 35/00* (2013.01); *B32B 2307/412* (2013.01); *B32B 2457/206* (2013.01); *B60K 35/50* (2024.01); *B60K 35/60* (2024.01); *B60K 2360/27* (2024.01); *B60K 2360/785* (2024.01); *B60K 2360/816* (2024.01); *B60Y 2200/11* (2013.01); *H10K 59/871* (2023.02)

(58) Field of Classification Search
  CPC ........ B60K 2360/785; B60K 2360/816; B60K 2360/347; B60Y 2200/11; H10K 59/871; B60R 11/02; G02F 1/1333; G09F 9/00
  See application file for complete search history.

(56) References Cited

U.S. PATENT DOCUMENTS

| | | |
|---|---|---|
| 2014/0078407 A1 | 3/2014 | Green et al. |
| 2015/0253612 A1 | 9/2015 | Hasegawa et al. |
| 2019/0197927 A1 | 6/2019 | Matsuoka et al. |

FOREIGN PATENT DOCUMENTS

| | | | |
|---|---|---|---|
| JP | 2004-529392 A | | 9/2004 |
| JP | 2006-162890 A | | 6/2006 |
| JP | 2007-071948 A | | 3/2007 |
| JP | 2018-052758 A | | 4/2018 |
| JP | 2019-117215 A | | 7/2019 |
| KR | 20180009086 A | * | 1/2018 |
| WO | 02/101188 A1 | | 12/2002 |
| WO | 2014/050138 A1 | | 4/2014 |

* cited by examiner

DISPLAY DEVICE, MOVABLE OBJECT

CROSS-REFERENCE OF RELATED APPLICATIONS

This application is the U.S. National Phase under 35 U.S.C. § 371 of International Patent Application No. PCT/JP2020/029963, filed on Aug. 5, 2020, which in turn claims the benefit of Japanese Patent Application No. 2019-191498, filed on Oct. 18, 2019, the entire disclosures of which Applications are incorporated by reference herein.

TECHNICAL FIELD

The present disclosure generally relates to display devices and movable objects. The present disclosure specifically relates to: a transmissive display device (transparent display device) which is configured to allow a back (background) to show through the transmissive display device; and a movable object including the display device.

BACKGROUND ART

Patent Literature 1 discloses a double-sided emissive transparent display device including an emissive display of, for example, organic EL, and the emissive display has an electrode part including at least one portion provided with a transparent electrode of, for example, ITO so that a background is visible through the double-sided emissive transparent display device.

CITATION LIST

Patent Literature

Patent Literature 1: JP 2007-71948 A

SUMMARY OF INVENTION

An object is to provide a display device and a movable object having improved durability while thermal insulation properties of the display device and the movable object are improved.

An aspect of the present disclosure is a display device and includes a glass pane, a display panel which is transmissive, and a glass panel unit. The display panel faces a prescribed area of the glass pane and is within the prescribed area. The glass panel unit is disposed between the prescribed area of the glass pane and the display panel, is within the prescribed area, and has an internal space which is in a pressure-reduced condition.

An aspect of the present disclosure is a movable object and includes the display device and a movable object body on which the display device is mounted as a window.

DESCRIPTION OF EMBODIMENTS

(1) Embodiment

(1-1) Overview

Figure 1:
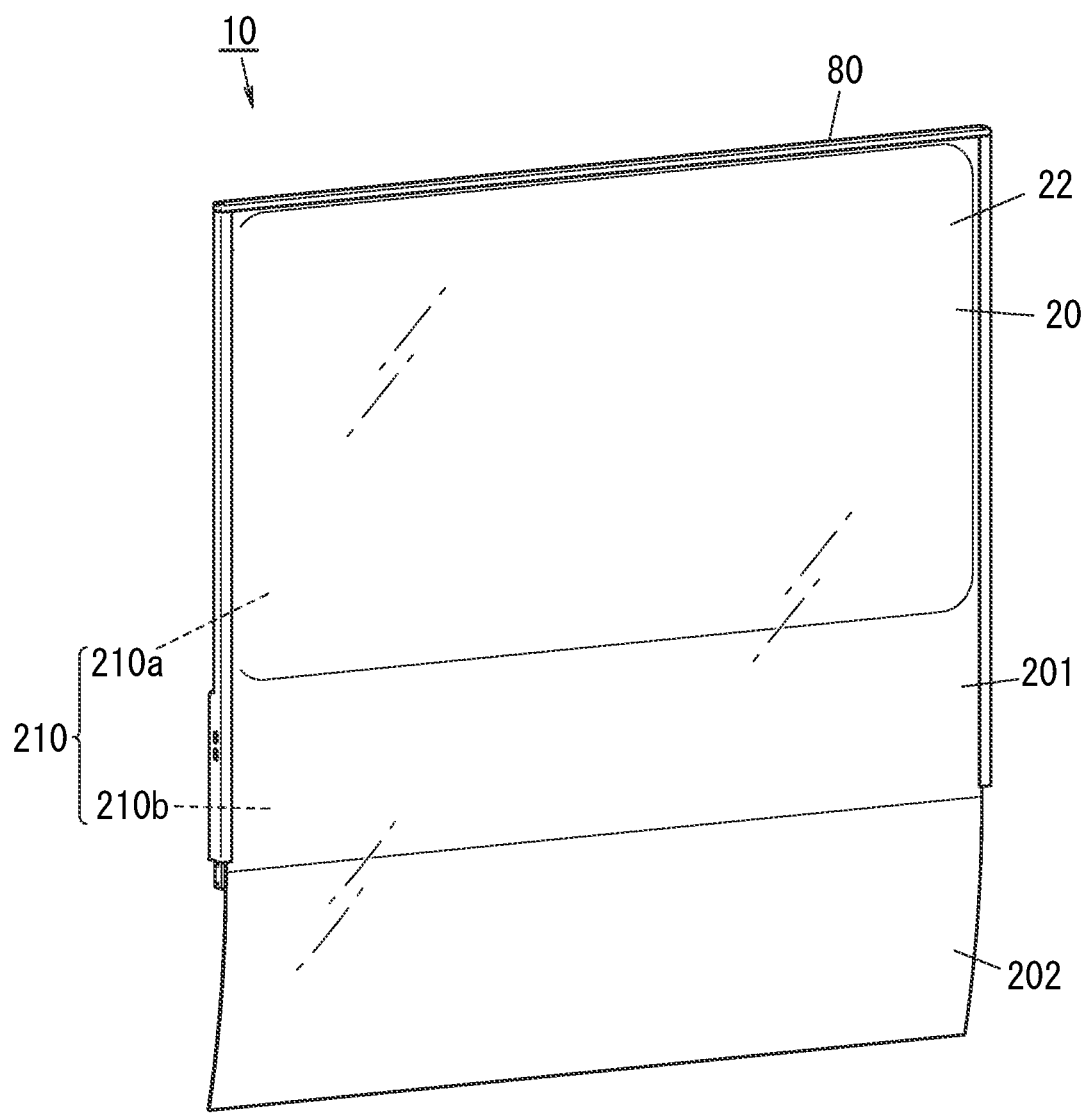
FIG. 1 is a front perspective view of a display device of an embodiment.
Figure 2:
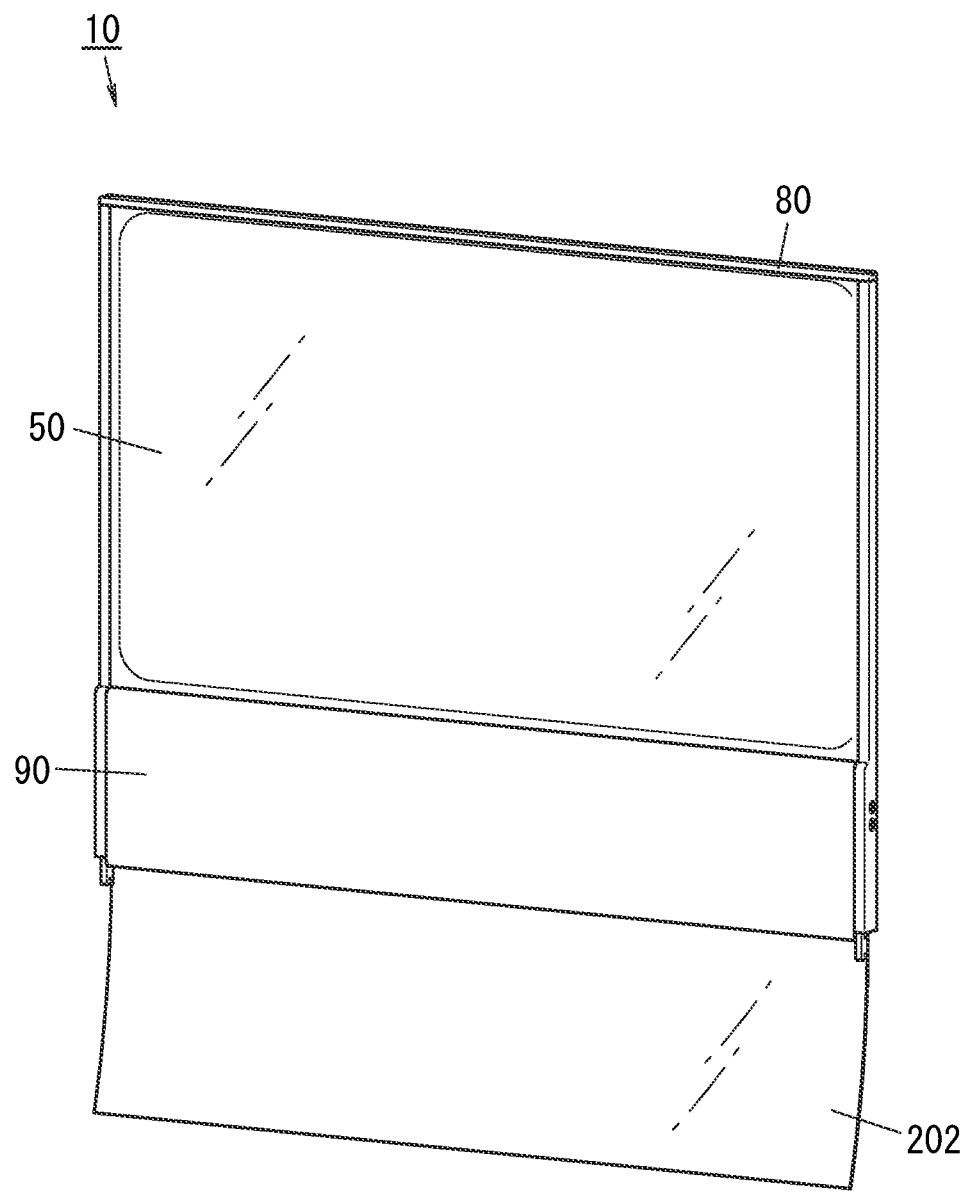
FIG. 2 is a rear perspective view of the display device.

FIGS. 1 and 2 show a display device 10 of an embodiment. The display device 10 is a so-called transmissive display device (transparent display device). The transmissive display device is configured to allow a back (background) of the transmissive display device to show through the transmissive display device. The transmissive display device is configured to allow a user to see the background and show a video as needed. Moreover, the transmissive display device is configured to display desired information by superimposing the desired information on the background without impairing the visibility of the background.

Figure 3:
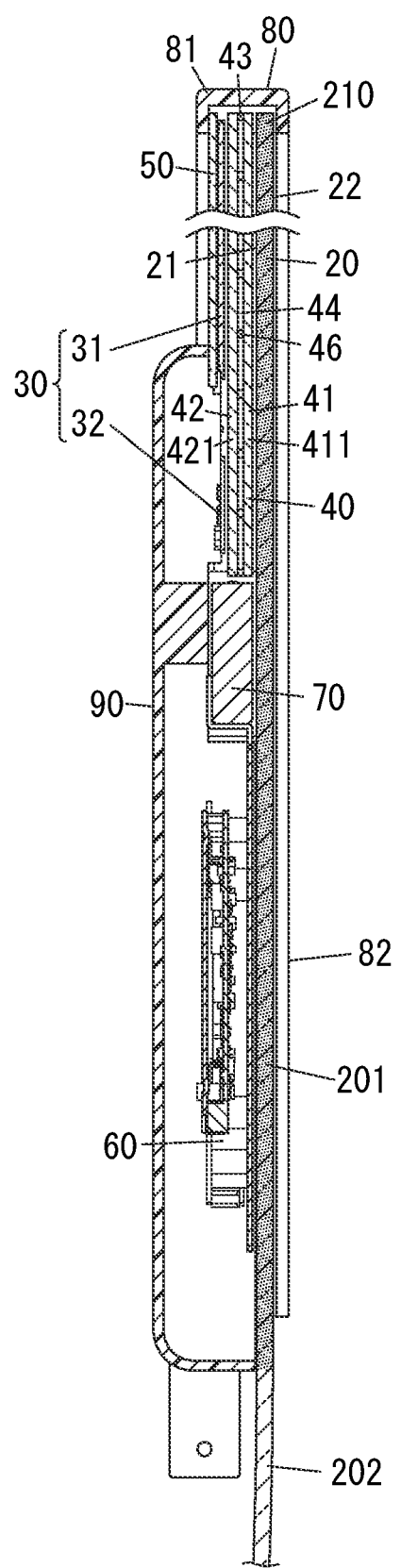
FIG. 3 is a partially omitted sectional view of the display device.

As shown in FIG. 3, the display device 10 of the present embodiment includes a glass pane 20, a display panel 31 which is transmissive, and a glass panel unit 40. The display panel 31 faces a prescribed area 210 of the glass pane 20 and is within the prescribed area 210. The glass panel unit 40 is disposed between the prescribed area 210 of the glass pane 20 and the display panel 31, is within the prescribed area 210, and has an internal space 44 which is in a pressure-reduced condition. Note that in FIG. 3, the prescribed area 210 are shaded so that the prescribed area 210 is clearly shown. Moreover, in FIG. 3, the glass panel unit 40 is shown in a simplified manner.

In the display device 10, the glass panel unit 40 is disposed between the display panel 31 and the glass pane 20. Since the glass panel unit 40 has the internal space 44 and the internal space 44 is in the pressure-reduced condition, the quantity of heat transmitted between the glass pane 20 and the display panel 31 can be reduced. Thus, in the display device 10, the glass panel unit 40 can protect the display panel 31 from heat and can thus improve thermal insulation properties. Moreover, the glass panel unit 40 is protected by the glass pane 20 and the display panel 31, and therefore, the possibility of damage on the glass panel unit 40 can be reduced, and durability can be improved. Thus, the display device 10 is improved in durability while the thermal insulation property of the display device 10 is improved.

(1-2) Details

Figure 4:
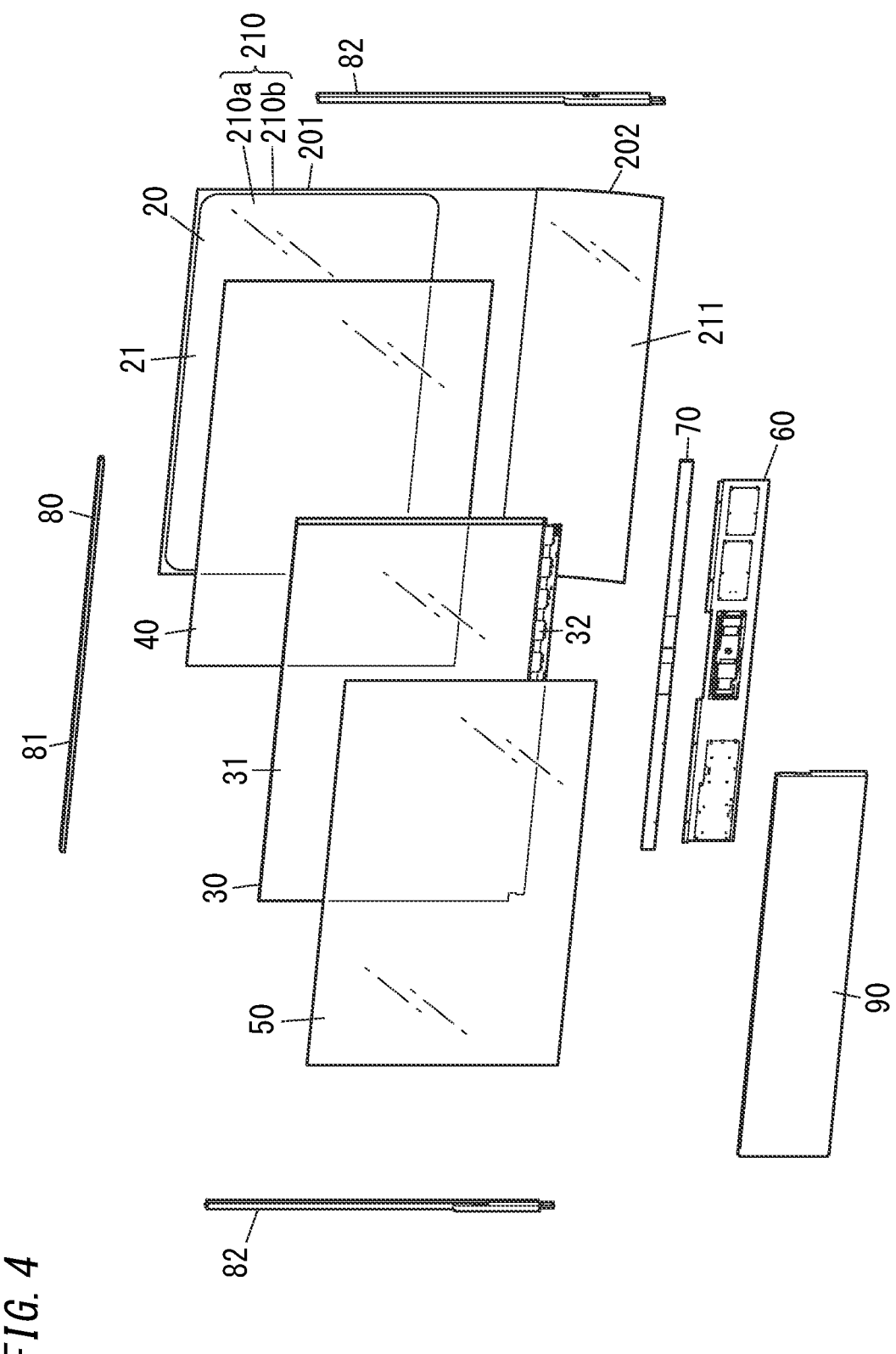
FIG. 4 is an exploded perspective view of the display device.

With reference to FIGS. 1 to 11, the display device 10 will be described in further detail. The display device 10 is a transmissive display device. As shown in FIG. 4, the display device 10 includes the glass pane 20, a display unit 30, the glass panel unit 40, a protection plate 50, a circuit part 60, a buffer member 70, a frame part 80, and a cover 90.

The glass pane 20 has a rectangular flat plate shape. Moreover, the glass pane 20 is transmissive to visible light so that the background is visible through the glass pane 20. In particular, the glass pane 20 is preferably colorless and transparent. Examples of materials for the glass pane 20 include soda-lime glass, high strain-point glass, no-alkali glass, quartz glass, and Neoceram. In the present embodiment, the glass pane 20 is a so-called strengthened glass. Examples of the strengthened glass include physically strengthened glass, chemically strengthened glass, and heat strengthened glass. Moreover, the glass pane 20 has a strength higher than the strength of the display panel 31 and higher than the strength of the glass panel unit 40. That is, the glass pane 20 has a function of protecting the display panel 31 and the glass panel unit 40.

The glass pane 20 has a first surface 21 (see FIG. 4) and a second surface 22 (see FIG. 1) which are both surfaces in a thickness direction defined with respect to the glass pane 20. The first surface 21 is a surface (inner surface) facing an inner side of the display device 10, and the second surface 22 is a surface (outer surface) facing an outer side of the display device 10. In the present embodiment, the glass pane 20 has a generally uniform thickness. The glass pane 20 is partially bent. That is, glass pane 20 is a bent glass pane. More specifically, as shown in FIG. 4, the glass pane 20 has one bent end (lower end in FIG. 4) in a direction (up/down direction in FIG. 4) corresponding to the vertical direction of the display panel 31. Thus, the glass pane 20 has a flat surface part 201 and a curved surface part 202. The flat surface part 201 has a flat rectangular plate shape. The curved surface part 202 is extended from one end of the flat surface part 201 and has a rectangular plate shape curved in the thickness direction. In the present embodiment, the first surface 21 is a flat surface at its portion corresponding to the flat surface part 201 and is a concave surface at its portion corresponding to the curved surface part 202. The second surface 22 is a flat surface at its portion corresponding to the flat surface part 201 and is a convex surface at its portion corresponding to the curved surface part 202.

Figure 7:
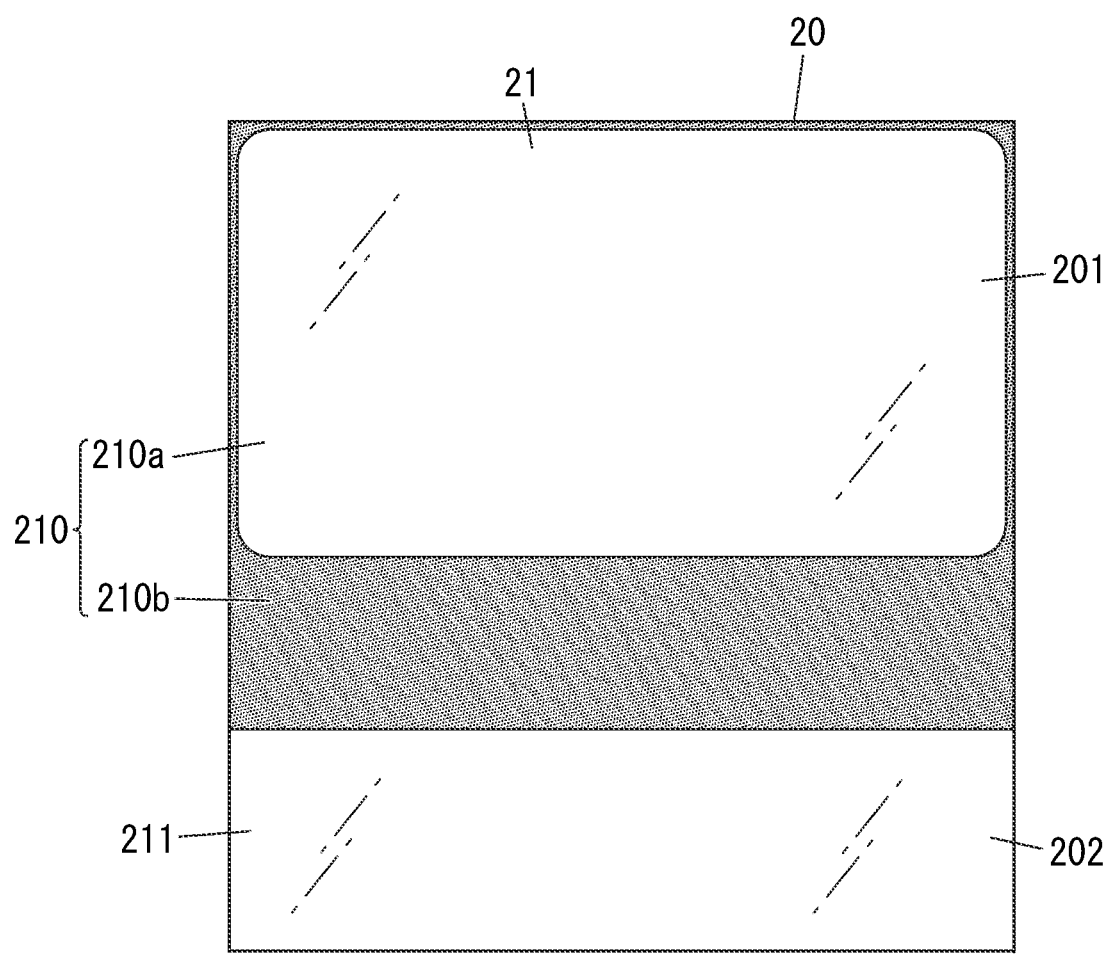
FIG. 7 is an illustrative view of the configuration of the display device.

The first surface 21 of the glass pane 20 has a prescribed area 210 and an attachment area 211. The prescribed area 210 is an area in which the display panel 31, the glass panel unit 40, and the protection plate 50 are to be disposed. In other words, the prescribed area 210 is an area to be used to display an image by the display panel 31. As illustrated in FIG. 7, the prescribed area 210 includes a transmissive area 210a and a non-transmissive area 210b. The transmissive area 210a is a light transmissive area. The transmissive area 210a has a rectangular shape. The non-transmissive area 210b is an area surrounding the transmissive area 210a. The non-transmissive area 210b is a light non-transmissive area. Note that in FIGS. 7 to 10, the non-transmissive area 210b is shaded with dots so that the non-transmissive area 210b is clearly shown. The non-transmissive area 210b has a rectangular frame shape. The non-transmissive area 210b is a darkly colored area. Note that the dark color can be black, blue, or the like. In the present embodiment, the non-transmissive area 210b is a black layer formed in a prescribed area of the first surface 21 of the glass pane 20 by print technology. The attachment area 211 is an area to be used to attach the display device 10 to an object. In the present embodiment, the prescribed area 210 is an area corresponding to the flat surface part 201, and the attachment area 211 is an area corresponding to the curved surface part 202.

In the display device 10, the display unit 30, the glass panel unit 40, and the protection plate 50 are stacked on one another on the glass pane 20. In particular, on the glass pane 20, the glass panel unit 40, the display unit 30, and the protection plate 50 are stacked on one another in this order.

The glass panel unit 40 is a vacuum insulated glass unit in the present embodiment. The vacuum insulated glass unit is a type of insulated glazing panels including at least a pair of glass panels and includes a vacuum space (or reduced pressure space) between the pair of glass panels.

Figure 5:
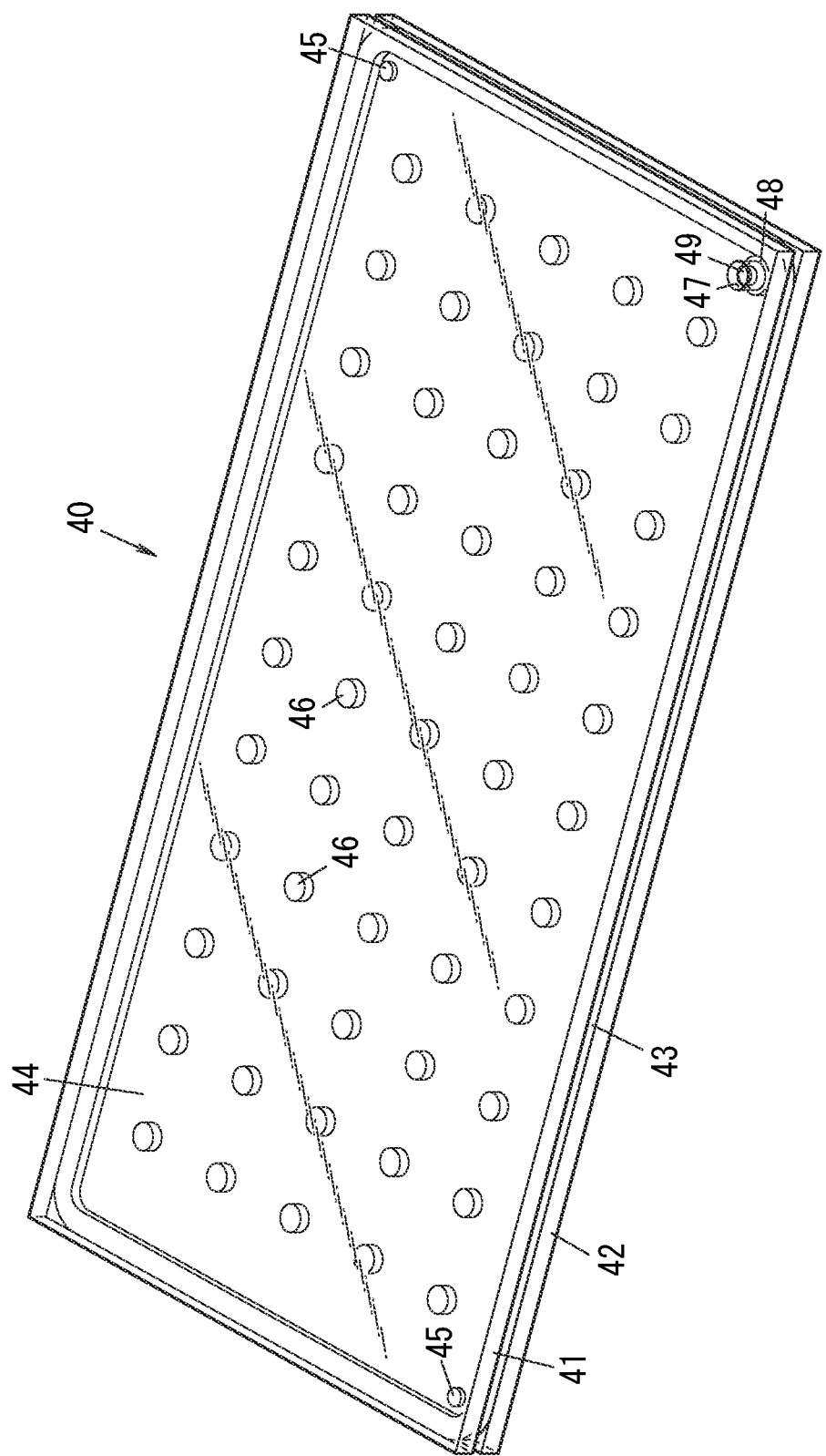
FIG. 5 is a perspective view of a glass panel unit of the display device.
Figure 6:
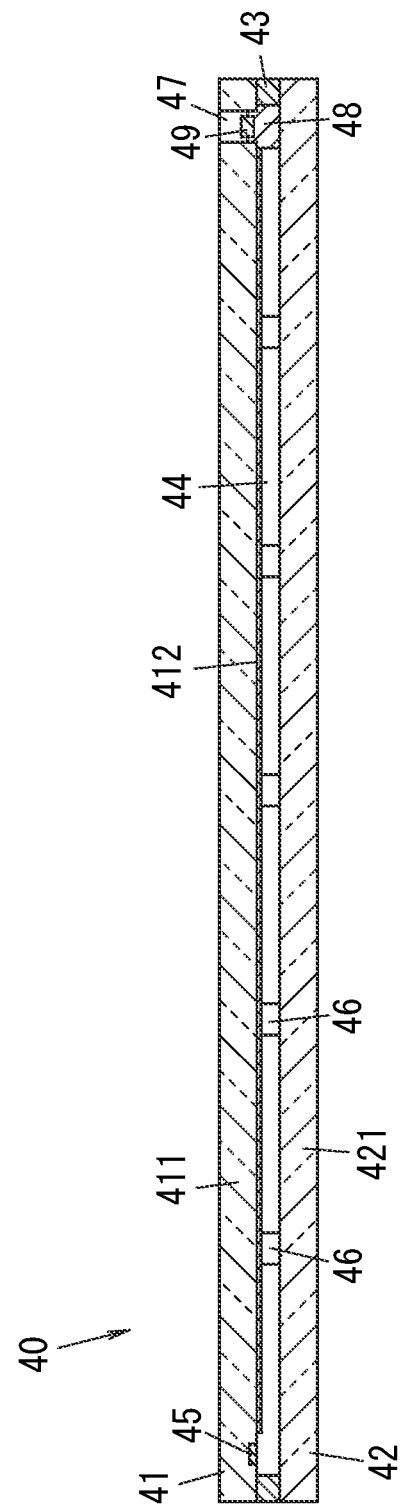
FIG. 6 is a sectional view of the glass panel unit.

As shown in FIGS. 5 and 6, the glass panel unit 40 includes a pair of panels (first and second panels) 41 and 42 and a frame member 43. Moreover, the glass panel unit 40 has the space (internal space) 44 surrounded by the pair of panels 41 and 42 and the frame member 43. The glass panel unit 40 further includes a gas adsorbent 45 and a plurality of pillars (spacer) 46 in the internal space 44. Note that in FIGS. 5 and 6, the dimension of the glass panel unit 40 are different from that in FIG. 4 so that the glass panel unit 40 is clearly shown.

The first and second panels 41 and 42 are disposed to face each other. In the present embodiment, the first and second panels 41 and 42 are disposed to face each other with a narrow gap left therebetween. The first panel 41 includes a first glass panel 411 and a low-emissivity film 412 formed on the first glass panel 411. The low-emissivity film 412 is a film containing metal, such as silver, with low emissivity and has the capability of reducing the transfer of heat due to radiation. The low-emissivity film 412 is formed on a surface, which faces the internal space 44, of the first glass panel 411. In the present embodiment, the low-emissivity film 412 is a so-called Low-E film. The size of the first glass panel 411 determines the size of the first panel 41. The second panel 42 includes a second glass panel 421. The second panel 42 is disposed to face the first panel 41. The size of the second glass panel 421 determines the size of the second panel 42. The first and second panels 41 and 42 have the same shape. The first and second panels 41 and 42 each have a rectangular flat plate shape. The first and second panels 41 and 42 are transmissive to visible light so that the background is visible through the glass panel unit 40. In particular, the first and second panels 41 and 42 are preferably colorless and transparent. Examples of materials for the first and second glass panels 411 and 421 of the first and second panels 41 and 42 include soda-lime glass, high strain-point glass, no-alkali glass, quartz glass, and Neoceram. In the present embodiment, the first and second glass panels 411 and 421 are a so-called strengthened glass. Examples of the strengthened glass include physically strengthened glass, chemically strengthened glass, and heat strengthened glass.

The frame member 43 is disposed between the first and second panels 41 and 42 and hermetically bonds the first and second panels 41 and 42 to each other. Thus, the internal space 44 surrounded by the first and second panels 41 and 42 and the frame member 43 is formed. In the present embodiment, the internal space 44 is in the pressure-reduced condition. More specifically, the internal space 44 is in a vacuum state. In other words, the internal space 44 has a pressure in the interior thereof, the pressure being lower than the atmospheric pressure. The frame member 43 is made of a thermal adhesive (a bonding material). In other words, the frame member 43 is a cured thermal adhesive. The thermal adhesive is, for example, glass frit. Examples of the glass frit include low-melting-point glass frit. Examples of the low-melting-point glass frit include bismuth-based glass frit, lead-based glass frit, and vanadium-based glass frit. The frame member 43 has an outer shape similar to the shape of each of the first and second panels 41 and 42. The frame member 43 is formed along outer perimeters of the first and second panels 41 and 42. Moreover, the thermal adhesive is not limited to the glass frit but may be, for example, low-melting-point metal or a hot-melt adhesive material.

The gas adsorbent 45 is disposed in the internal space 44. Specifically, the gas adsorbent 45 has a circular plate shape and is disposed on the first panel 41. The gas adsorbent 45 is in the vicinity of an outer edge of the first panel 41 (that is, an outer edge of the glass panel unit 40). In particular, in the present embodiment, two of four corners of the first panel 41 are provided with gas adsorbents 45. The gas adsorbent 45 is used to adsorb unnecessary gas (for example, remaining gas). The unnecessary gas is, for example, gas released from the thermal adhesive when the thermal adhesive is heated to form the frame member 43. The gas adsorbent 45 contains a getter. The getter is a material having a property of adsorbing molecules smaller than a prescribed size. The getter is, for example, an evaporable getter. The evaporable getter has a property of releasing adsorbed molecules at or higher than a predetermined temperature (activation temperature). Thus, even when the adsorption capacity of the evaporable getter decreases, heating the evaporable getter to or higher than the activation temperature enables the adsorption capacity of the evaporable getter to be recovered. The evaporable getter is, for example, zeolite or ion-exchanged zeolite (e.g., copper ion-exchanged zeolite). The gas adsorbent 45 contains powder of the getter. Specifically, the gas adsorbent 45 is formed by applying and solidifying a liquid containing powder of the getter (e.g., a dispersion obtained by dispersing powder of the getter in a liquid, or a solution obtained by dissolving powder of the getter in a liquid). In this case, the gas adsorbent 45 may be reduced in size. Thus, even when the internal space 44 is small, the gas adsorbent 45 can be disposed.

The plurality of pillars 46 are disposed in the internal space 44. The plurality of pillars 46 are used to maintain a prescribed space between the first and second panels 41 and 42. That is, the plurality of pillars 46 are used to maintain a desired distance between the first and second panels 41 and 42. Note that, sizes of the pillars 46, the number of the pillars 46, the interval between the pillars 46, and the arrangement pattern of the pillars 46 may be accordingly selected. Each pillar 46 has a solid cylindrical shape having substantially the same height as the prescribed gap. For example, each pillar 46 is preferably dimensioned so as to be visually less obvious to a user. For example, each pillar 46 has a diameter of 1 mm and a height of 100 μm. Note that each pillar 46 may have a desired shape such as a prism shape or a spherical shape. Each of the plurality of pillars 46 may be entirely or partially made of a resin such as polyimide.

The glass panel unit 40 further has an exhaust port 47. The exhaust port 47 is formed in at least one of the first panel 41 or the second panel 42. In the present embodiment, the exhaust port 47 is formed in only the first panel 41. Moreover, the exhaust port 47 is in the vicinity of the outer edge of the first panel 41 (that is, the outer edge of the glass panel unit 40). In the present embodiment, the exhaust port 47 is located at a corner of the first panel 41. The exhaust port 47 is used to reduce the pressure in the internal space 44. That is, gas in the internal space 44 is exhausted via the exhaust port 47, thereby achieving the pressure-reduced condition in the internal space 44. After the pressure-reduced condition in the internal space 44 is achieved, the exhaust port 47 is sealed. To seal the exhaust port 47, a sealing material 48 and a pressing member 49 are used. The sealing material 48 and the pressing member 49 are each dimensioned so as to be insertable in the exhaust port 47. The sealing material 48 is, for example, glass frit. The pressing member 49 has a plate shape. The pressing member 49 is disposed on an opposite side of the sealing material 48 from the second panel 42. While the gas is exhausted via the exhaust port 47 from the internal space 44, the sealing material 48 is melted, and the pressing member 49 deforms the sealing material 48, thereby closing the exhaust port 47. Thus, the internal space 44 is sealed with the internal space 44 being in the pressure-reduced condition.

Figure 8:
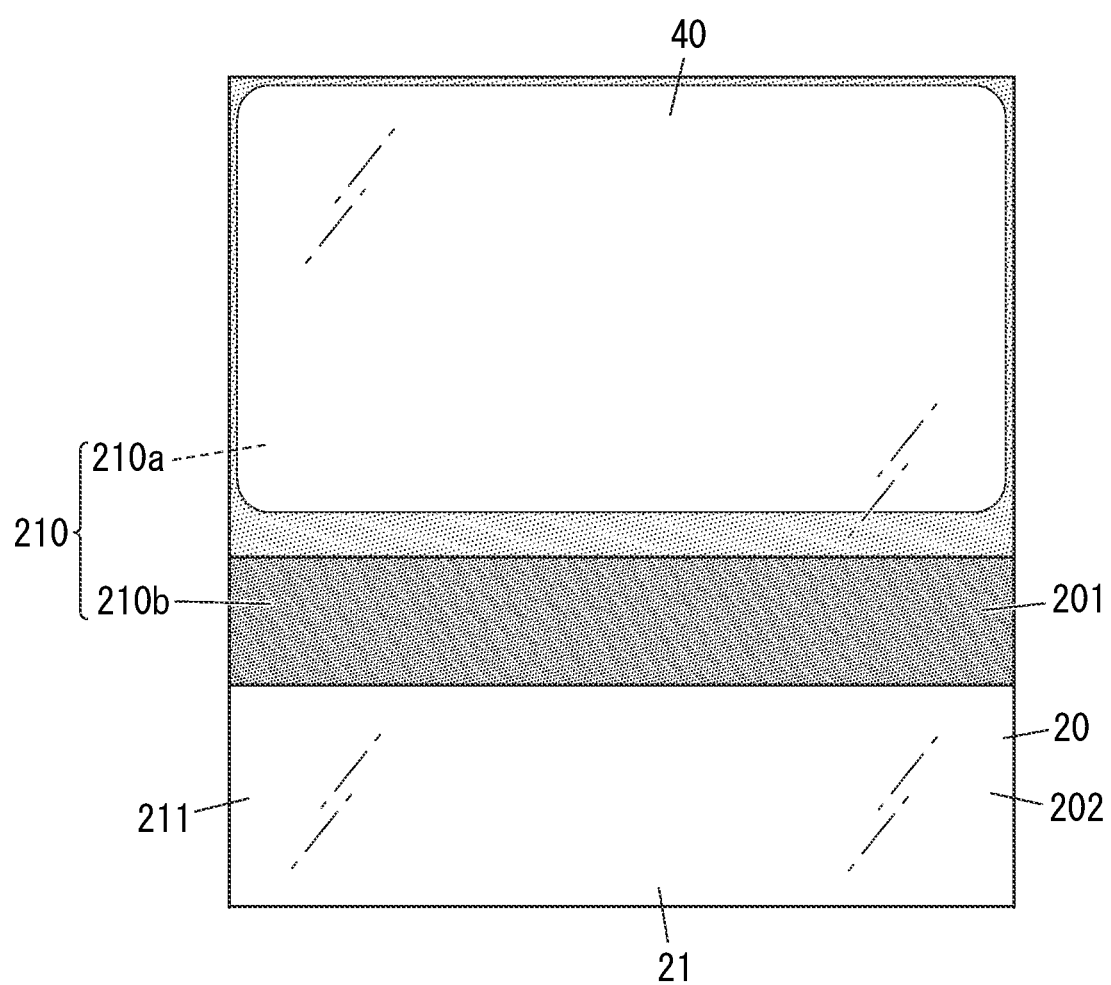
FIG. 8 is an illustrative view of the configuration of the display device.

The glass panel unit 40 has a generally rectangular plate shape. As shown in FIG. 8, the glass panel unit 40 is disposed on the first surface 21 of the glass pane 20. More specifically, the glass panel unit 40 is disposed in the prescribed area 210 of the glass pane 20. The glass panel unit 40 has a size within the prescribed area 210 of the glass pane 20. The dimension of the glass panel unit 40 is equal to the dimension of the glass pane 20 in a direction corresponding to the lateral direction of the display panel 31 (left/right direction in FIG. 8). In the present embodiment, the glass panel unit 40 is greater than the transmissive area 210a of the prescribed area 210, and the outer edge (including the frame member 43) of the glass panel unit 40 is in the non-transmissive area 210b. In particular, both side surfaces of the glass pane 20 coincide with both side surfaces of the glass panel unit 40 in both directions corresponding to the lateral direction of the display panel 31 (left/right direction in FIG. 8). Moreover, a side surface of the glass pane 20 coincides with a side surface of the glass panel unit 40 in one direction corresponding to the vertical direction of the display panel 31 (upward direction in FIG. 8). Moreover, in the glass panel unit 40, the gas adsorbent 45 and the exhaust port 47 are located in the vicinity of the outer edge of the glass panel unit 40. In the present embodiment, the gas adsorbent 45 and the exhaust port 47 are also in the non-transmissive area 210b. In FIG. 8, the gas adsorbent 45 and the exhaust port 47 are not shown.

Figure 11:
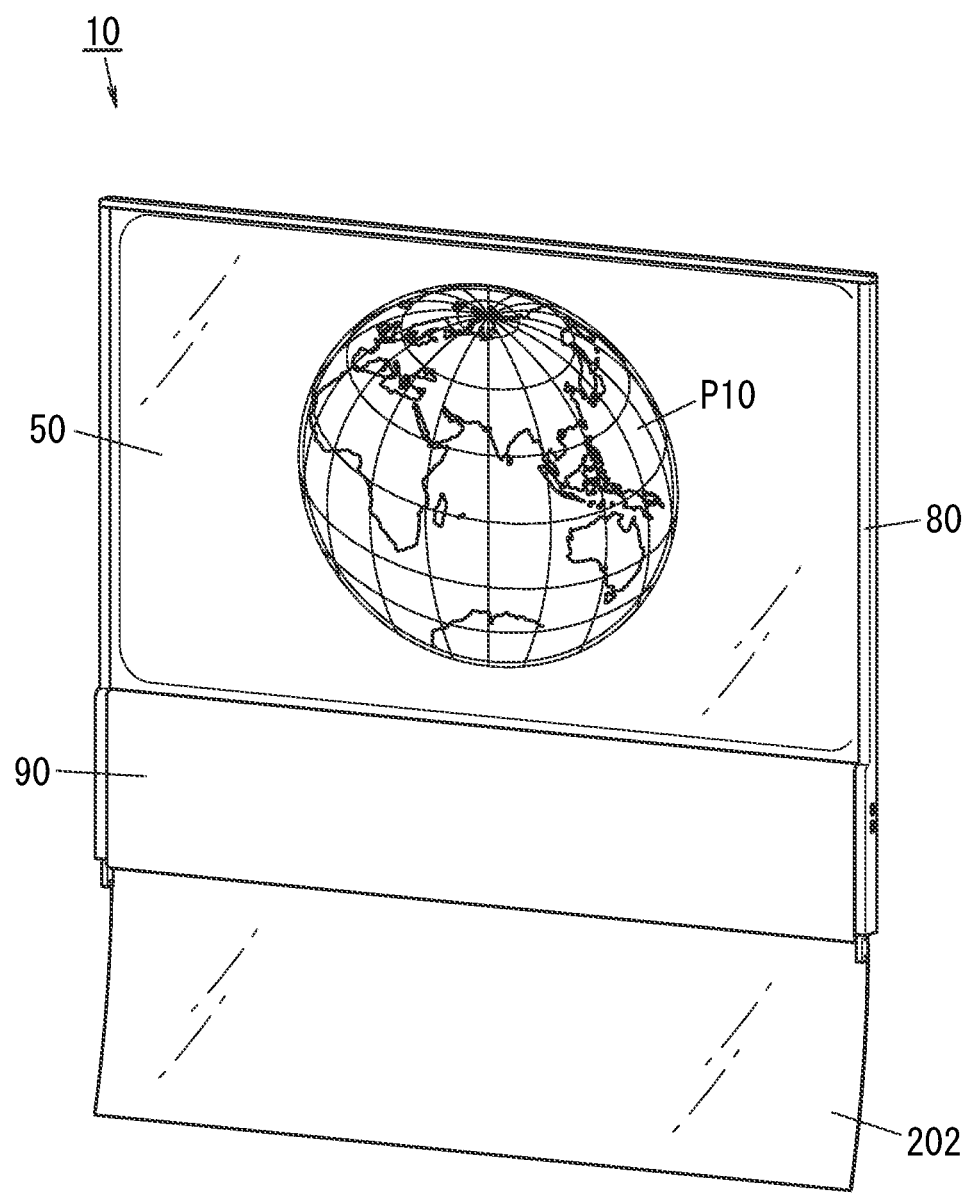
FIG. 11 is an illustrative view of an example of use of the display device.

The display unit 30 is a function unit for displaying an image P10 (see FIG. 11). The display unit 30 includes the display panel 31 and a driver 32.

Figure 9:
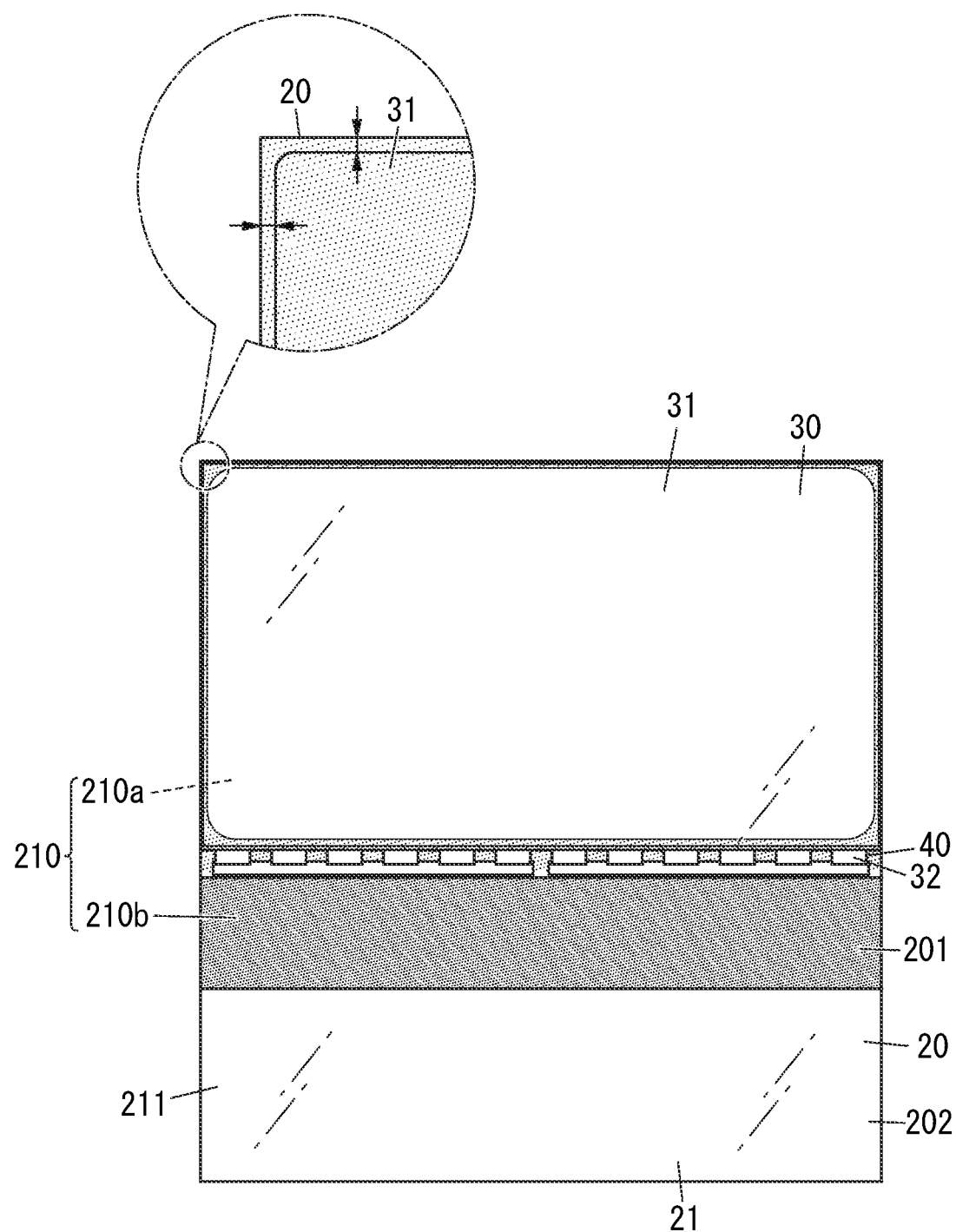
FIG. 9 is an illustrative view of the configuration of the display device.

The display panel 31 is a transmissive display. Examples of the transmissive display include a display including a transparent organic light-emitting diode (OLED). Note that the configuration of displaying images by the display panel 31 may be a conventionally known configuration, and the detailed description thereof is thus omitted. The display panel 31 has a generally rectangular plate shape. As shown in FIGS. 3 and 9, the display panel 31 is disposed on an opposite surface of the glass panel unit 40 from the glass pane 20. More specifically, the display panel 31 is disposed in the prescribed area 210 of the glass pane 20 in plan view. The display panel 31 has a size within the prescribed area 210 of the glass pane 20. The dimension of the display panel 31 is smaller than the dimension of the glass pane 20 in the direction corresponding to the lateral direction of the display panel 31 (left/right direction in FIG. 9) but is greater than the dimension of the transmissive area 210a of the prescribed area 210. In the present embodiment, the display panel 31 is greater than the transmissive area 210a of the prescribed area 210, and the display panel 31 has an outer edge located in the non-transmissive area 210b. In particular, both side surfaces of the display panel 31 are on an inner side of the display device 10 with respect to both the side surfaces of the glass pane 20 in both the directions corresponding to the lateral direction of the display panel 31 (left/right direction in FIG. 9). Moreover, a side surface of the display panel 31 is on an inner side of the display device 10 with respect to the side surface of the glass pane 20 in the one direction corresponding to the vertical direction of the display panel 31 (upward direction in FIG. 9).

The driver 32 is a device for controlling the display panel 31 to display an image onto the display panel 31. The configuration of the driver 32 may be a conventionally known configuration, and the detailed description thereof is thus omitted. The driver 32 is disposed not to overlap the display panel 31. In the present embodiment, the driver 32 is disposed, at one end (lower end in FIG. 9) in the vertical direction (length direction, height direction) of the display panel 31, along the lateral direction (width direction) of the display panel 31. As shown in FIGS. 3 and 9, the driver 32 is disposed on the opposite surface of the glass panel unit 40 from the glass pane 20. That is, the glass panel unit 40 is not only between the display panel 31 and the prescribed area 210 of the glass pane 20 but also between the driver 32 and the prescribed area 210 of the glass pane 20.

Figure 10:
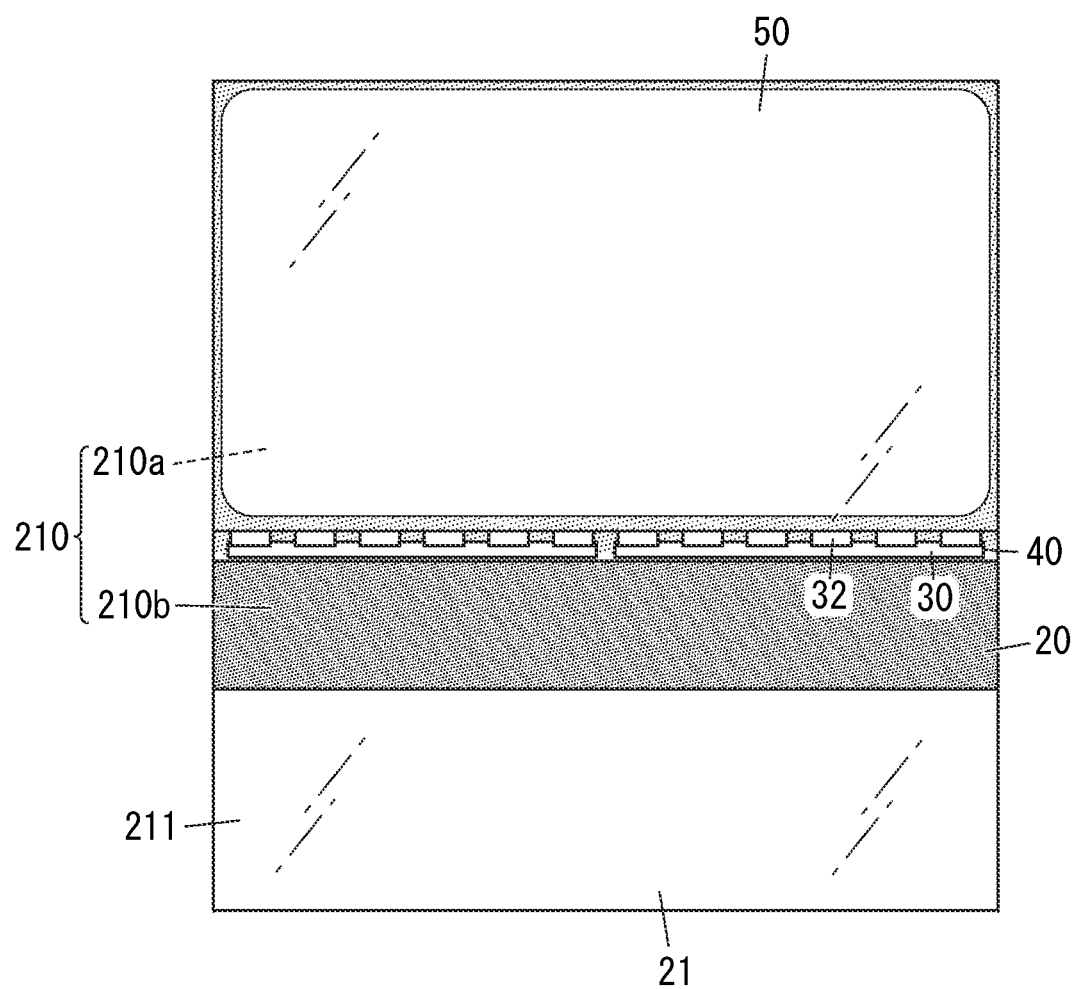
FIG. 10 is an illustrative view of the configuration of the display device.

The protection plate 50 has a generally rectangular flat plate shape. As shown in FIGS. 3 and 10, the protection plate 50 is disposed on an opposite side of the display panel 31 from the glass panel unit 40. More specifically, the protection plate 50 is disposed in the prescribed area 210 of the glass pane 20 in plan view. The protection plate 50 has a size within the prescribed area 210 of the glass pane 20. The dimension of the protection plate 50 is equal to the dimension of the glass pane 20 in the direction corresponding to the lateral direction of the display panel 31 (left/right direction in FIG. 10). In the present embodiment, the protection plate 50 is greater than the transmissive area 210a of the prescribed area 210, and the protection plate 50 has an outer edge in the non-transmissive area 210b. In particular, both the side surfaces of the glass pane 20 coincide with both side surfaces of the protection plate 50 in both the directions corresponding to the lateral direction of the display panel 31 (left/right direction in FIG. 10). Moreover, the side surface of the glass pane 20 coincide with a side surface of the protection plate 50 in the one direction corresponding to the vertical direction of the display panel 31 (upper direction in FIG. 10). Note that the protection plate 50 has a dimension set in a direction corresponding to the vertical direction of the display panel 31 such that the driver 32 is exposed. Moreover, the protection plate 50 has generally the same thickness. Both surfaces in a thickness direction defined with respect to the protection plate 50 are flat surfaces. Moreover, the protection plate 50 is transmissive to visible light so that an image projected by the display panel 31 is visible through the protection plate 50. In particular, the protection plate 50 is preferably colorless and transparent. Examples of materials for the protection plate 50 include soda-lime glass, high strain-point glass, no-alkali glass, quartz glass, and Neoceram. In the present embodiment, the protection plate 50 is a so-called strengthened glass. Examples of the strengthened glass include physically strengthened glass, chemically strengthened glass, and heat strengthened glass. Moreover, the protection plate 50 has a strength higher than the strength of the display panel 31 and higher than the strength of the glass panel unit 40. That is, the protection plate 50 has a function of protecting the display panel 31 and the glass panel unit 40.

The circuit part 60 is a function unit for controlling the display unit 30. The circuit part 60 controls, based on an image signal (video signal) given from an external device, the display unit 30 to cause the display panel 31 to display an image. The circuit part 60 is disposed in the prescribed area 210 on the first surface 21 of the glass pane 20. In particular, the circuit part 60 is disposed in the vicinity of the attachment area 211 in the non-transmissive area 210b of the prescribed area 210.

As shown in FIG. 3, the buffer member 70 is disposed between the glass panel unit 40 and the circuit part 60. The buffer member 70 prevents the glass panel unit 40 and the circuit part 60 from coming into collision with each other, thereby protecting the glass panel unit 40 and the circuit part 60. The buffer member 70 has an elongated square bar shape. The buffer member 70 may be made of a well-known material as a buffer material such as urethane foam.

The frame part 80 is configured to collectively cover at least part of the outer edge of the glass pane 20, the display panel 31, the glass panel unit 40, and the protection plate 50. In particular, in the present embodiment, the glass pane 20, the display panel 31, the glass panel unit 40, and the protection plate 50 each have a rectangular plate shape. As shown in FIGS. 1 and 2, the frame part 80 is configured to cover three sides of four sides constituting the outer edge of the glass pane 20, the display panel 31, the glass panel unit 40, and the protection plate 50. In particular, the frame part 80 covers three sides corresponding to the prescribed area 210 of the glass pane 20 of the four sides constituting the outer edge of the glass pane 20, the display panel 31, the glass panel unit 40, and the protection plate 50. As shown in FIG. 4, the frame part 80 includes a first side part 81 and a pair of second side parts 82. The first side part 81 and the pair of second side parts 82 each has an elongated bar shape and a U-shaped cross section orthogonal to a length direction defined with respect to each of the first side part 81 and the pair of second side parts 82. That is, into the first side part 81 and the pair of second side parts 82, the outer edge of the glass pane 20, the display panel 31, the glass panel unit 40, and the protection plate 50 is partially inserted (see FIG. 3). Note that the frame part 80 may be made of a resin material. The frame part 80 may be made of a metal material.

The cover 90 is a member for protecting the driver 32 and the circuit part 60. The cover 90 is in the shape of a rectangular box with one surface being open. The cover 90 is disposed on the first surface 21 of the glass pane 20. In particular, as illustrated in FIG. 3, the cover 90 is disposed on the first surface 21 of the glass pane 20 to cover the driver 32 and the circuit part 60. Note that the cover 90 may be made of a resin material. The cover 90 may be made of a metal material.

(1-3) Example of Use

Figure 12:
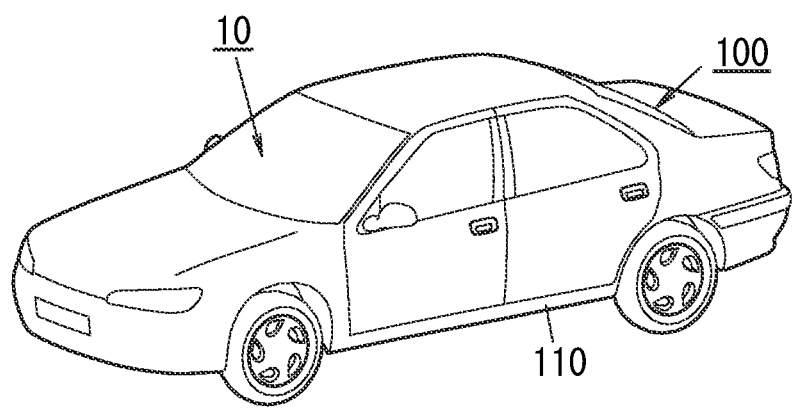
FIG. 12 is an illustrative view of a movable object including the display device.

As shown in FIG. 11, the display device 10 of the present embodiment is configured to display the image P10 by the display panel 31. Moreover, the display device 10 is a transmissive display device, and thus, a back (background) is visible through the display device 10. That is, the display device 10 is configured to show the background and show a video such as the image P10 as needed. Moreover, the display device 10 is configured to display desired information as the image P10 by superimposing the image P10 on the background without impairing the visibility of the background. In an example, the display device 10 is applicable to a movable object 100 as shown in FIG. 12. In this case, an object to which the display device 10 is to be attached may be a movable object body 110 of the movable object 100. Here, the movable object 100 is a vehicle, and is, in this embodiment, an automobile. That is, the movable object body 110 is a car body. The display device 10 is mounted as a window (windshield) of the movable object 100 on the movable object body 110. In this case, the display device 10 is configured to display various types of drive assistance information such as vehicle speed information, navigation information, pedestrian information, front vehicle information, lane departure information, and vehicle condition information by superimposition on the background by the display panel 31 to make a user visually recognize the information.

Note that the display device 10 is applicable not only to the automobile but may be applicable also to a movable object, such as a two-wheel vehicle, a train, an aircraft, construction machinery, and a marine vessel, other than the automobile. Moreover, the display device 10 is applicable not only to the movable object but may be applicable also to a stationary object. Examples of the stationary object include vending machines, showcases, and facilities. Also in the case of the vending machines, the showcases, and facilities, the display device 10 is usable as a window. Note that examples of the facilities include dwelling houses (e.g., detached dwelling houses, multiple dwelling houses), non-dwelling houses (e.g., factories, commercial facilities, amusement facilities, hospitals, offices, and buildings).

(2) Variation

The embodiment in the present disclosure is not limited to the embodiment described above. Rather, the embodiment described above may be readily modified in various manners depending on a design choice or any other factor without departing from the scope of the present disclosure. Variations of the embodiment described above will be enumerated below.

In the embodiment described above, the display device 10 has a rectangular shape, but the display device 10 may have a desired shape such as a circular shape or a polygonal shape. That is, the glass pane 20, the display panel 31, the glass panel unit 40, and the protection plate 50 do not have to have a rectangular shape but may have a desired shape such as a circular shape or a polygonal shape. Moreover, the shape and/or size of the display device 10 are/is determined based on applications of the display device 10. For example, the display device 10 may have a shape according to a window (windshield, side window, rear window, or the like) of the movable object 100.

In a variation, the display device 10 does not have to include the protection plate 50. Moreover, the display device 10 does not have to include the circuit part 60. Moreover, the display device 10 does not have to include the buffer member 70. Moreover, the display device 10 does not have to include the frame part 80. Moreover, the display device 10 does not have to include the cover 90.

In a variation, the glass pane 20 may include a functional layer having a desired physical property on at least one of the first surface 21 or the second surface 22. The function layer is, for example, a film (infrared reflective film, ultraviolet reflecting film) which reflects light of a specific wavelength, a glass film for improving strength, an anti-reflection coating, or the like. The function layer may be formed by coating or may be formed by affixing a film. This similarly applies to the display panel 31, the glass panel unit 40, and the protection plate 50.

In a variation, the glass pane 20 may be a decorated bent glass pane, a laminated bent glass pane, or a bent glazing pane. The glass pane 20 is not limited to the bent glass pane but may alternatively be a flat glass. That is, the glass pane 20 does not have to have the curved surface part 202 but may have only the flat surface part 201.

In the embodiment described above, the display panel 31 of the display unit 30 is a display (transparent OLED display) including a transparent OLED but may be, for example, a transparent liquid crystal or transparent LED display. That is, as the display panel 31, a conventionally known transmissive display or transparent display may be adopted.

In a variation, the display panel 31 may be bonded via an intermediate film to the glass panel unit 40. When the intermediate film is used, a shatterproof effect of glass can be expected in case of damage on the display panel 31 and/or the glass panel unit 40. Examples of a material for the intermediate film include EVA, PVB, an ionomer resin, and a polyolefin-based adhesive polymer. The intermediate film is preferably transmissive to visible light so that the background is visible through the intermediate film. In particular, the intermediate film is preferably colorless and transparent. Note that the display panel 31 and the glass panel unit 40 may be bonded to each other by direct bonding of resin embedding. That is, the display panel 31 and the glass panel unit 40 may be bonded to each other by an adhesive without a gap therebetween. Examples of the adhesive include an optically clear adhesive (OCA) and an ultraviolet curing resin.

In a variation, the configuration of the glass panel unit 40 is not limited to the configuration described above but may be the same configuration as the conventionally known vacuum insulated glass unit. In an example, the glass panel unit 40 may have a configuration without the exhaust port 47. Since a glass panel unit without an exhaust port is known, the description thereof is not particularly given.

In a variation, the glass panel unit 40 may be bonded to the glass pane 20 via the intermediate film as described above. Note that the glass panel unit 40 and the glass pane 20 may be bonded to each other by direct bonding of resin embedding. That is, the glass panel unit 40 and the glass pane 20 may be bonded to each other by the adhesive as described above without a gap therebetween.

In a variation, the protection plate 50 may be bonded to the display panel 31 via the intermediate film as described above. Note that the protection plate 50 and the display panel 31 may be bonded to each other by direct bonding of resin embedding. That is, the protection plate 50 and the display panel 31 may be bonded to each other by an adhesive without a gap therebetween.

(3) Aspects

A first aspect of the present disclosure is a display device (10) and includes a glass pane (20), a display panel (31) which is transmissive, and a glass panel unit (40). The display panel (31) faces a prescribed area (210) of the glass pane (20) and is within the prescribed area (210). The glass panel unit (40) is disposed between the prescribed area (210) of the glass pane (20) and the display panel (31), is within the prescribed area (210), and has an internal space (44) which is in a pressure-reduced condition. With this aspect, durability is improved while thermal insulation properties are improved.

A second aspect is a display device (10) referring to the first aspect. In the second aspect, the glass pane (20) has an attachment area (211) for attachment to an object (110). The attachment area (211) is in an area not overlapping the prescribed area (210) in the glass pane (20). This aspect facilitates attachment of the display device (10) to the object (110).

A third aspect is a display device (10) referring to the first or second aspect. In the third aspect, the glass pane (20) has a flat surface part (201) and a curved surface part (202). The prescribed area (210) is in the flat surface part (201). This aspect facilitates disposition of the display panel (31).

A fourth aspect is a display device (10) referring to any one of the first to third aspects. In the fourth aspect, the display device (10) further includes a driver (32) configured to drive the display panel (31). The driver (32) is disposed not to overlap the display panel (31). With this aspect, the driver (32) is disposed at a place where the driver (32) has no influence over the visibility of an image (P10) provided by the display panel (31).

A fifth aspect is a display device (10) referring to the fourth aspect. In the fifth aspect, the driver (32) is disposed on an opposite surface of the glass panel unit (40) from the glass pane (20). With this aspect, the glass panel unit (40) is used also to protect the driver (32) from heat.

A sixth aspect is a display device (10) referring to any one of the first to fifth aspects. In the sixth aspect, the prescribed area (210) has a transmissive area (210a) and a non-transmissive area (210b) surrounding the transmissive area (210a). The glass panel unit (40) has an outer edge in the non-transmissive area (210b). With this aspect, the outer edge of the glass panel unit (40) is hidden by the non-transmissive area (210b).

A seventh aspect is a display device (10) referring to the sixth aspect. In the seventh aspect, the non-transmissive area (210b) is a darkly colored area. With this aspect, the outer edge of the glass panel unit (40) is hidden by the non-transmissive area (210b).

An eighth aspect is a display device (10) referring to the sixth or seventh aspect. In the eighth aspect, the glass panel unit (40) has an exhaust port (47) sealed with a sealing material (48). The exhaust port (47) is in the non-transmissive area (210b). This aspect makes the exhaust port (47) less visually obvious.

A ninth aspect is a display device (10) referring to any one of the first to eighth aspects. In the ninth aspect, the glass pane (20) has a strength higher than a strength of the display panel (31) and higher than a strength of the glass panel unit (40). With this aspect, the display panel (31) and the glass panel unit (40) is protected by the glass pane (20).

The tenth aspect is a movable object (100) and includes: the display device (10) of any one of the first to ninth aspects; and a movable object body (110) on which the display device (10) is mounted as a window. With this aspect, durability is improved while thermal insulation properties are improved.

REFERENCE SIGNS LIST

10 Display Device
20 Glass Pane
201 Flat Surface Part
202 Curved Surface Part
210 Prescribed Area
210a Transmissive Area
210b Non-Transmissive Area
211 Attachment Area
31 Display Panel
32 Driver
40 Glass Panel Unit
44 Internal Space
47 Exhaust Port
48 Sealing Material
P10 Image
100 Movable Object
110 Movable Object Body

The invention claimed is:

1. A display device comprising:
a glass pane;
a display panel facing a prescribed area of the glass pane, the display panel being within the prescribed area, and being transmissive;
a glass panel unit provided between the prescribed area of the glass pane and the display panel, the glass panel unit being within the prescribed area and having an internal space which is in a pressure-reduced condition; and
a driver configured to drive the display panel, wherein
the driver is disposed not to overlap the display panel,
the driver is disposed on an opposite surface of the glass panel unit from the glass pane, and
the glass panel unit is between the driver and the prescribed area of the glass pane.

2. The display device of claim 1, wherein
the glass pane has an attachment area for attachment to an object, and
the attachment area is in an area not overlapping the prescribed area in the glass pane.

3. The display device of claim 1, wherein
the glass pane has a flat surface part and a curved surface part, and
the prescribed area is in the flat surface part.

4. The display device of claim 1, wherein
the prescribed area includes a transmissive area and a non-transmissive area surrounding the transmissive area, and
the glass panel unit has an outer edge in the non-transmissive area.

5. The display device of claim 4, wherein
the non-transmissive area is a darkly colored area.

6. A display device comprising:
a glass pane;
a display panel facing a prescribed area of the glass pane, the display panel being within the prescribed area, and being transmissive; and
a glass panel unit between the prescribed area of the glass pane and the display panel, the glass panel unit provided within the prescribed area and having an internal space which is in a pressure-reduced condition, wherein
the prescribed area includes a transmissive area and a non-transmissive area surrounding the transmissive area,
the glass panel unit has an outer edge in the non-transmissive area,
the glass panel unit has an exhaust port sealed with a sealing material, and
the exhaust port is in the non-transmissive area.

7. A display device comprising:
a glass pane;
a display panel facing a prescribed area of the glass pane, the display panel being within the prescribed area, and being transmissive; and
a glass panel unit between the prescribed area of the glass pane and the display panel, the glass panel unit provided within the prescribed area and having an internal space which is in a pressure-reduced condition, wherein
the glass pane has a strength higher than a strength of the display panel and higher than a strength of the glass panel unit.

8. A movable object comprising:
the display device of claim 1; and
a movable object body on which the display device is mounted as a window.

9. The display device of claim 2, wherein
the glass pane has a flat surface part and a curved surface part, and
the prescribed area is in the flat surface part.

10. The display device of claim 2, wherein
the prescribed area includes a transmissive area and a non-transmissive area surrounding the transmissive area, and
the glass panel unit has an outer edge in the non-transmissive area.

11. The display device of claim 3, wherein
the prescribed area includes a transmissive area and a non-transmissive area surrounding the transmissive area, and
the glass panel unit has an outer edge in the non-transmissive area.

12. The display device of claim 5, wherein
the glass panel unit has an exhaust port sealed with a sealing material, and
the exhaust port is in the non-transmissive area.

13. The display device of a claim 2, wherein
the glass pane has a strength higher than a strength of the display panel and higher than a strength of the glass panel unit.

14. The display device of a claim 3, wherein
the glass pane has a strength higher than a strength of the display panel and higher than a strength of the glass panel unit.

\* \* \* \* \*